(12) United States Patent
Lee et al.

(10) Patent No.: US 7,998,874 B2
(45) Date of Patent: Aug. 16, 2011

(54) METHOD FOR FORMING HARD MASK PATTERNS HAVING A FINE PITCH AND METHOD FOR FORMING A SEMICONDUCTOR DEVICE USING THE SAME

(75) Inventors: Hak-sun Lee, Suwon-si (KR);
Myeong-cheol Kim, Suwon-si (KR);
Kyung-yub Jeon, Yongin-si (KR);
Cha-won Koh, Yongin-si (KR);
Ji-young Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 834 days.

(21) Appl. No.: 11/978,719

(22) Filed: Oct. 30, 2007

(65) Prior Publication Data

US 2008/0131793 A1    Jun. 5, 2008

Related U.S. Application Data

(63) Continuation-in-part of application No. 11/367,437, filed on Mar. 6, 2006, now Pat. No. 7,473,647, and a continuation-in-part of application No. 11/896,512, filed on Sep. 4, 2007, now Pat. No. 7,687,369.

(30) Foreign Application Priority Data

Jul. 6, 2007 (KR) .................. 10-2007-0068170

(51) Int. Cl.
*H01L 21/461* (2006.01)
*C03C 15/00* (2006.01)

(52) U.S. Cl. ............... 438/725; 216/41; 216/58; 216/83

(58) Field of Classification Search ................ 216/4, 58, 216/83, 37; 438/689; 430/314, 5; 257/E21.038, 257/E21.039, E21.235, E21.236
See application file for complete search history.

(56) References Cited

U.S. PATENT DOCUMENTS

| | | |
|---|---|---|
| 5,891,799 A | 4/1999 | Tsui |
| 6,239,008 B1 | 5/2001 | Yu et al. |
| 6,403,417 B1 | 6/2002 | Chien et al. |
| 6,790,770 B2 | 9/2004 | Chen et al. |
| 7,202,174 B1 | 4/2007 | Jung et al. |
| 7,256,126 B1 | 8/2007 | Chen |

(Continued)

FOREIGN PATENT DOCUMENTS

JP    2006-261307    9/2006

(Continued)

*Primary Examiner* — Nadine G Norton
*Assistant Examiner* — Patti Lin
(74) *Attorney, Agent, or Firm* — Lee & Morse, P.C.

(57) ABSTRACT

A method for forming hard mask patterns includes, sequentially forming first, second, and third hard mask layers formed of materials having different etching selectivities on a substrate, forming first sacrificial patterns having a first pitch therebetween on the third hard mask layer, forming fourth hard mask patterns with a second pitch between the first sacrificial patterns, the second pitch being substantially equal to about ½ of the first pitch, patterning the third hard mask layer to form third hard mask patterns using the fourth hard mask patterns as an etch mask, patterning the second hard mask layer to form second hard mask patterns using the third and fourth hard mask patterns as an etch mask, and patterning the first hard mask layer to form first hard mask patterns with the second pitch therebetween using the second and third hard mask patterns as an etch mask.

12 Claims, 11 Drawing Sheets

U.S. PATENT DOCUMENTS

| | | |
|---|---|---|
| 7,312,158 B2 | 12/2007 | Miyagawa et al. |
| 2003/0027420 A1 | 2/2003 | Lai et al. |
| 2003/0207584 A1 | 11/2003 | Sivakumar et al. |
| 2004/0017989 A1 | 1/2004 | So |
| 2004/0266098 A1* | 12/2004 | Huang et al. ................ 438/243 |
| 2005/0040134 A1* | 2/2005 | Temmler et al. ............... 216/13 |
| 2005/0269702 A1 | 12/2005 | Otsuka |
| 2006/0046484 A1* | 3/2006 | Abatchev et al. ............ 438/689 |
| 2006/0234166 A1 | 10/2006 | Lee et al. |
| 2006/0263699 A1 | 11/2006 | Abatchev et al. |
| 2007/0123037 A1 | 5/2007 | Lee et al. |
| 2008/0026541 A1 | 1/2008 | Edelstein et al. |
| 2008/0048340 A1 | 2/2008 | Lee et al. |
| 2008/0131793 A1 | 6/2008 | Lee et al. |

FOREIGN PATENT DOCUMENTS

| | | |
|---|---|---|
| KR | 10-0155880 B1 | 7/1998 |
| KR | 1998-0025458 A | 7/1998 |
| KR | 10-0165399 B1 | 9/1998 |
| KR | 10-2003-0050172 A | 6/2003 |
| KR | 10-2004-0055459 A | 6/2004 |
| KR | 10-2006-0000678 A | 1/2006 |
| KR | 10-0574999 B1 | 4/2006 |
| KR | 10-2006-0110097 A | 10/2006 |
| KR | 10-0672123 B1 | 1/2007 |

* cited by examiner

METHOD FOR FORMING HARD MASK PATTERNS HAVING A FINE PITCH AND METHOD FOR FORMING A SEMICONDUCTOR DEVICE USING THE SAME

CROSS-REFERENCE TO RELATED APPLICATIONS

The present application is a continuation-in-part application of U.S. patent application Ser. No. 11/367,437, entitled, "Method of Forming Pattern Using Fine Pitch Hard Mask," which was filed on Mar. 6, 2006, and issued on Jan. 6, 2009, as U.S. Pat. No. 7,473,647, which is incorporated by reference herein in its entirety. The present application is also a continuation-in-part application of U.S. patent application Ser. No. 11/896,512, entitled, "Method of Forming Fine Metal Patterns for a Semiconductor Device Using a Damascene Process," which was filed on Sep. 4, 2007, and issued on Mar. 30, 2010, as U.S. Pat. No. 7,687,369, which is incorporated by reference herein in its entirety. The present application is also related to co-pending U.S. patent application Ser. No. 11/978,718, entitled, "Method for Forming Fine Patterns of a Semiconductor Device Using a Double Patterning Process," which was filed on Oct. 30, 2007, which is incorporated by reference herein in its entirety.

BACKGROUND OF THE INVENTION

1. Field of the Invention

Embodiments of the present invention relate to a method for manufacturing a semiconductor device. More particularly, embodiments of the present invention relate to a method for forming hard mask patterns having a reduced pitch therebetween using a double patterning process, and a method for forming a semiconductor device using the same.

2. Description of the Related Art

In general, manufacturing of highly integrated semiconductor devices may require formation of a large number of miniaturized elements, e.g., semiconductor patterns, and integration thereof within a small area. Conventional formation of semiconductor patterns, e.g., interconnect patterns, may be achieved via, e.g., photolithography and film patterning. Integration of semiconductor devices in a small area may require a reduced pitch therebetween, i.e., a reduced sum of a width of one pattern and a width of one space between adjacent patterns.

Reducing a pitch between adjacent semiconductor patterns may be limited when using a conventional photolithography process due to resolution restrictions, e.g., when forming a line and space (L/S) pattern on a substrate. Further, conventional formation of a hard mask having fine patterns with a reduced pitch therebetween may be complex and may provide uneven and/or short pattern profiles, thereby triggering potential pattern collapse and/or electrical failures.

SUMMARY OF THE INVENTION

Embodiments of the present invention are therefore directed to a method for forming a hard mask with fine patterns and a method for forming a semiconductor device using the same, which substantially overcome one or more of the disadvantages of the related art.

It is therefore a feature of an embodiment of the present invention to provide a method for forming a hard mask having patterns with a fine pitch therebetween via a photolithography process.

It is another feature of an embodiment of the present invention to provide a method for forming a semiconductor device using a hard mask having patterns having sufficient height and fine pitch therebetween via a photolithography process.

At least one of the above and other features and advantages of the present invention may be realized by providing a method for forming hard mask patterns, including sequentially forming a first hard mask layer, a second hard mask layer, and a third hard mask layer on a substrate, each hard mask layer being formed of a material having a different etching selectivity with respect to an adjacent hard mask layer, forming first sacrificial patterns having a first pitch therebetween on the third hard mask layer, forming fourth hard mask patterns between the first sacrificial patterns, such that the fourth hard mask patterns are having a second pitch therebetween, the second pitch being substantially equal to about ½ of the first pitch, patterning the third hard mask layer to form third hard mask patterns with the second pitch therebetween using the fourth hard mask patterns as an etch mask, patterning the second hard mask layer to form second hard mask patterns with the second pitch therebetween using the third and fourth hard mask patterns as an etch mask, and patterning the first hard mask layer to form first hard mask patterns with the second pitch therebetween using the second and third hard mask patterns as an etch mask.

The first sacrificial patterns may be formed of a substantially same material as the third hard mask layer. The first, second, and third hard mask layers may be formed of first, second, and third materials, respectively, each one of the first, second, and third materials being an oxide, a nitride, or a polysilicon, such that each of the first, second, and third materials being different from one another. Forming the first sacrificial patterns may include forming an etching prevention layer on the third hard mask layer, forming a first sacrificial film on the etching prevention layer, and patterning the first sacrificial film by a photolithography process. Forming the fourth hard mask patterns may include forming a fourth hard mask layer having a uniform thickness on lateral and upper surfaces of each of the first sacrificial patterns. The thickness of the fourth hard mask layer may be adjusted to form recess regions between the first sacrificial patterns.

Forming the fourth hard mask patterns may include removing a portion of the fourth hard mask layer to expose upper surfaces of the first sacrificial patterns, such that each first sacrificial pattern is between and in direct contact with two fourth hard mask patterns. The method may further include removing the first sacrificial patterns using the fourth hard mask patterns.

The method may further include removing portions of the first sacrificial layer to form etching prevention patterns. The method may further include forming a second sacrificial film in the recess regions, removing upper portions of the second sacrificial film and of the fourth hard mask layer to form second sacrificial patterns and fourth hard mask patterns, respectively, removing the first and second sacrificial patterns to expose upper surfaces of the etching prevention patterns and of bottom portions of the fourth hard mask patterns, and etching back the etching prevention patterns and bottom portions of the fourth hard mask patterns to form reduced height fourth hard mask patterns on the third hard mask layer. The first and second sacrificial patterns may be formed of a substantially same material as the third hard mask layer. Each of the first and second sacrificial patterns may be formed of polysilicon. Removing the first and second sacrificial patterns may include removal via wet etching, dry etching, and/or a combination thereof.

At least one of the above and other features and advantages of the present invention may be realized by providing a method for forming fine patterns of a semiconductor device, including sequentially forming a first hard mask layer, a second hard mask layer, and a third hard mask layer on a substrate, each hard mask layer being formed of a material having a different etching selectivity with respect to an adjacent hard mask layer, forming first sacrificial patterns having a first pitch therebetween on the third hard mask layer, forming fourth hard mask patterns between the first sacrificial patterns, such that the fourth hard mask patterns are having a second pitch therebetween, the second pitch being substantially equal to about ½ of the first pitch, patterning the third hard mask layer to form third hard mask patterns with the second pitch therebetween using the fourth hard mask patterns as an etch mask, patterning the second hard mask layer to form second hard mask patterns with the second pitch therebetween using the third and fourth hard mask patterns as an etch mask, patterning the first hard mask layer to form first hard mask patterns with the second pitch therebetween using the second and third hard mask patterns as an etch mask, forming a plurality of trenches with the second pitch therebetween in the substrate using the first hard mask patterns as an etch mask, and filling the trenches with an insulation film to form isolation areas in the substrate.

The method may further include forming a pad oxide film between the substrate and the first hard mask layer, the first hard mask layer being formed of a nitride. Each of the second hard mask layer and the third hard mask layer may be formed of an oxide or a polysilicon, the second and third hard mask layers being formed of different materials. The method may further include forming an etching prevention layer between the third hard mask layer and the first sacrificial patterns. Forming the fourth hard mask patterns may include forming a fourth hard mask layer having a uniform thickness on lateral and upper surfaces of each of the first sacrificial patterns, the thickness of the fourth hard mask layer being adjusted to form recess regions between the first sacrificial patterns. Forming the fourth hard mask patterns may include removing a portion of the fourth hard mask layer to expose upper surfaces of the first sacrificial patterns, and removing the first sacrificial patterns. Forming of the fourth hard mask pattern may include forming a second sacrificial film in the recess regions, removing upper portions of the second sacrificial film and of the fourth hard mask layer to form second sacrificial patterns and fourth hard mask patterns, respectively, removing the first and second sacrificial patterns to expose upper surfaces of the etching prevention patterns and of bottom portions of the fourth hard mask patterns, and etching back the etching prevention patterns and bottom portions of the fourth hard mask patterns to form reduced height fourth hard mask patterns on the third hard mask layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1A:
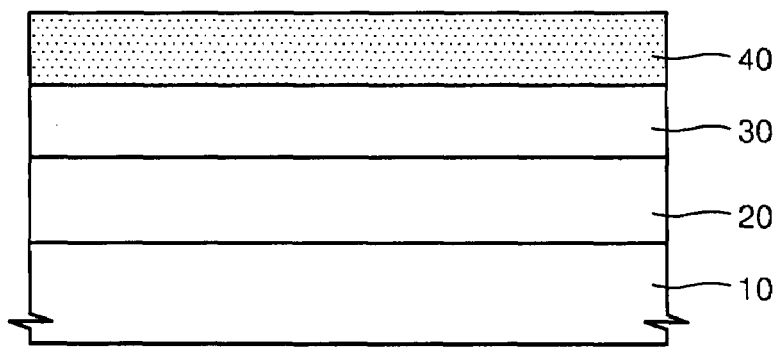
FIGS. 1A-1I illustrate cross sectional views of a semiconductor device during sequential stages of a method for forming hard mask patterns thereon according to an embodiment of the present invention.

Korean Patent Application No. 10-2007-0068170, filed on Jul. 6, 2007, in the Korean Intellectual Property Office, and entitled, "Method for Forming Fine Pitch Hard Mask Pattern and Method for Fine Pattern of Semiconductor Device," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present. Like reference numerals refer to like elements throughout.

An exemplary embodiment of a method for forming hard mask patterns on a semiconductor device of the present invention will now be described more fully with reference to FIGS. 1A-1I.

Referring to FIG. 1A, a first hard mask layer 20, a second hard mask layer 30, and a third hard mask layer 40 having different etching selectivities may be sequentially deposited on a substrate 10.

The substrate 10 may be any suitable semiconductor substrate, e.g., a silicon substrate. A plurality of unit devices (not shown), e.g., transistors, may be formed on the substrate 10. An interlayer insulation film (not shown) may be formed on an upper surface of the substrate 10 to cover the unit devices. Also, a plurality of conductive areas (not shown) may be electrically connected to the unit devices through the interlayer insulation film, and may be exposed on the upper surface of the substrate 10.

Each of the first hard mask layer 20, second hard mask layer 30, and third hard mask layer 40 may be formed of an oxide, a nitride, and/or a polysilicon. The materials of the first hard mask layer 20, second hard mask layer 30, and third hard mask layer 40 may be selected so that the first hard mask layer 20, second hard mask layer 30, and third hard mask layer 40 may be formed of different materials with respect to one another, thereby exhibiting different etching selectivities.

More specifically, the first hard mask layer 20 may be formed of any suitable material selected with respect to an etching film (not shown) included in the substrate 10 and a type of pattern to be formed thereon. For example, when a trench is formed to define an active area in the substrate 10, the hard mask layer 20 may be formed of an oxide film, a nitride film, or a combination thereof. In another example, when the etching film included in the substrate 10 is an insulation film or a conductive film, the hard mask layer 20 may be formed of a material having a different etching selectivity with respect to the material of the etching film.

The second hard mask layer 30 may be formed of a material having a different etching selectivity with respect to the first hard mask layer 20, i.e., a material capable of being etched at different etching conditions as compared to the first hard mask layer 20. For example, when the first hard mask layer 20 is formed of a nitride, the second hard mask layer 30 may be formed of an oxide, e.g., one or more of a medium temperature oxide (MTO) film, a thermal oxide film, a chemical vapor deposition (CVD) oxide film, an undoped silicate glass (USG) film, and/or a high density plasma (HDP) oxide film. In another example, when the first hard mask layer 20 is formed of an oxide, the second hard mask layer 30 may be formed of a nitride, e.g., one or more of silicon oxynitride (SiON), silicon nitride ($Si_3N_4$), silicon boron nitride (SiBN), and/or boron nitride (BN).

The third hard mask layer 40 may be formed of a material having different etching selectivity with respect to the second hard mask layer 30. For example, when the second hard mask layer 30 is formed of an oxide or a nitride, the third hard mask layer 40 may be formed of a polysilicon.

Figure 1B:
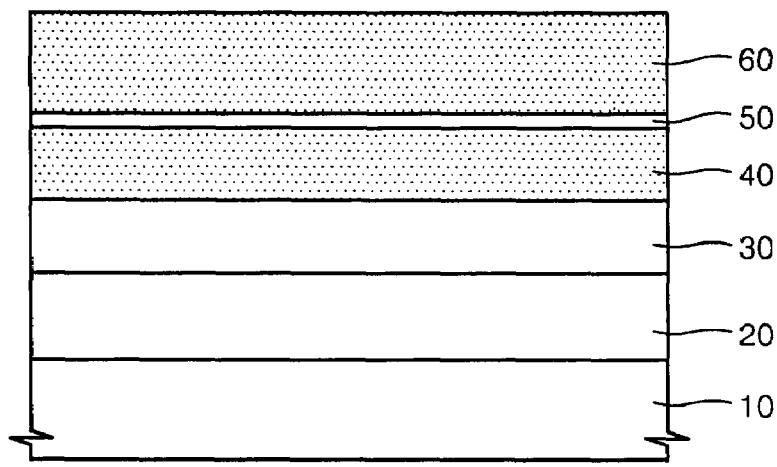

Referring to FIG. 1B, an etching prevention layer 50 may be formed on the third hard mask layer 40, followed by formation of a first sacrificial film 60 on the etching prevention layer 50. The etching prevention layer 50 may be formed of an oxide or a nitride. For example, when the first, second, and third hard mask layers 20, 30, and 40 are formed of a nitride, an oxide, and polysilicon, respectively, the etching prevention layer 50 may be formed of an oxide. The etching prevention layer 50 may have a thickness of, e.g., about 50 angstroms to about 500 angstroms. Alternatively, the etching prevention layer 50 may be omitted.

The first sacrificial film 60 may be formed of a material having an etching selectivity that may be substantially similar to that of the third hard mask layer 40. For example, if the etching prevention layer 50 is formed of an oxide or a nitride, the first sacrificial film 60 may be formed of polysilicon. In another example, if the etching prevention layer 50 is formed of a nitride, the first sacrificial film 60 may be formed of an oxide having a superior planarizing characteristic, e.g., a silicon-on-glass (SOG) film or a flowable oxide film (FOX film). The material for the first sacrificial film 60 may be determined with respect to the materials of the first hard mask layer 20 and the etching film included in the substrate 10.

Figure 1C:
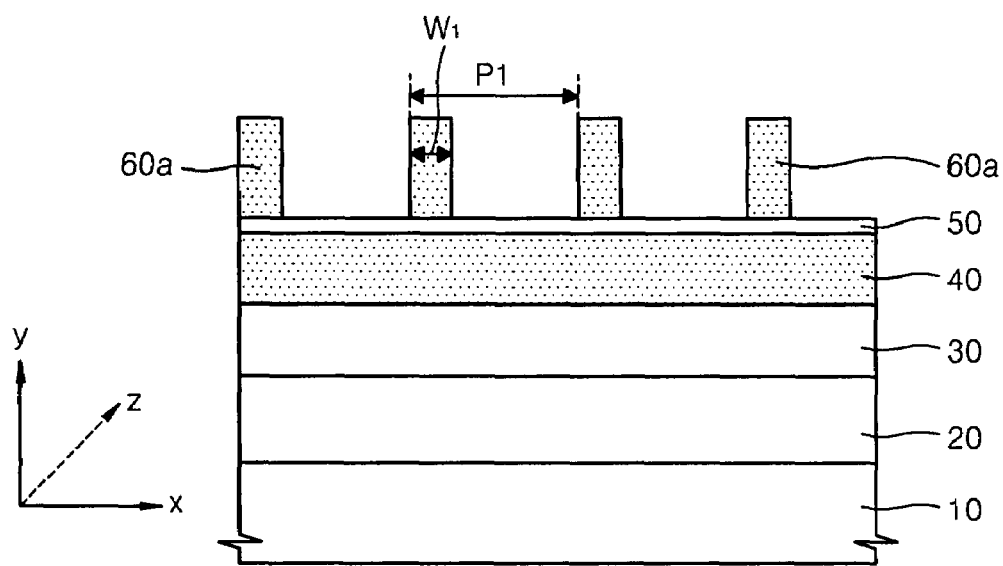

Referring to FIG. 1C, the first sacrificial film 60 may be patterned, e.g., using a photolithography process, to form first sacrificial patterns 60a, e.g., patterns having a cross-section of a plurality of repeating lines or rectangles in a predetermined direction in the xz-plane. The first sacrificial patterns 60a may have a first pitch P1 therebetween, and each pattern of the first sacrificial patterns 60a may have a first width W1. The first width W1 may substantially equal about ¼ of the first pitch P1. In this respect, it is noted that a "pitch" hereinafter refers to a sum of a width of a single pattern and a width of a single gap between two adjacent patterns, e.g., the first pitch P1 may refer to a sum of the first width W1 and a width of a gap between two adjacent patterns of the first sacrificial patterns 60a, as illustrated in FIG. 1B. A "width" hereinafter refers to a distance as measured along the x-axis.

Figure 1D:
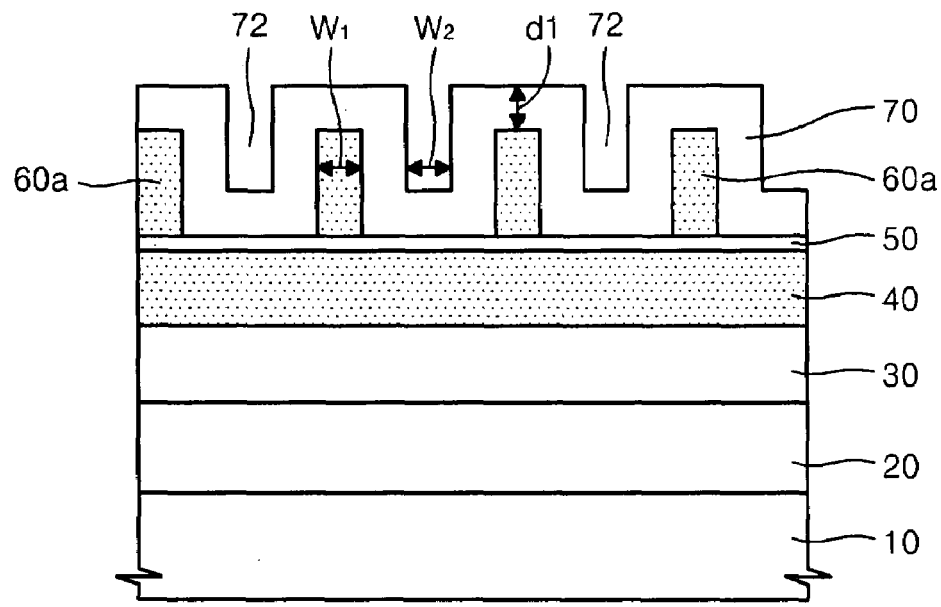

Referring to FIG. 1D, a fourth hard mask layer 70 may be formed on the etching prevention layer 50 and the first sacrificial patterns 60a. More specifically, the fourth hard mask layer 70 may be deposited to a uniform thickness to cover outer surfaces, i.e., upper and/or sidewall surfaces, of the first sacrificial patterns 60a and the etching prevention layer 50.

The fourth hard mask layer 70 may have a first thickness d1, i.e., a vertical distance as measured along the y-axis, so that a recess region 72 having a second width W2 may be formed between every two adjacent first sacrificial patterns 60a. More specifically, each recess region 72a may be defined between outer surfaces of two adjacent vertical portions of the first sacrificial patterns 60a, i.e., portions of the fourth hard mask layer 70 coated on sidewall surfaces of adjacent and facing first sacrificial patterns 60a. The first thickness d1 of the fourth hard mask layer 70 may be substantially uniform, and may be adjusted, so the second width W2 of the recess regions 72 may substantially equal the first width W1 of the first sacrificial patterns 60a, i.e., may equal about ¼ of the first pitch P1. The first thickness d1 may substantially equal the first width W1.

The fourth hard mask layer 70 may be formed of a material having a substantially similar etching selectivity to that of the material of the etching prevention layer 50 and/or the material of the second hard mask layer 30. For example, the fourth hard mask layer 70 and the etching prevention layer 50 and/or the second hard mask layer 30 may be formed of a substantially same material. In another example, the fourth hard mask layer 70 may be formed, e.g., of an oxide, and the etching prevention layer 50 and/or the second hard mask layer 30 may be formed of a different material having a substantially similar etch selectivity with respect to the oxide.

Further, the fourth hard mask layer 70 may be formed of a material having a substantially different etching selectivity than the material of the first sacrificial patterns 60a. For example, when the first sacrificial patterns 60a are formed of polysilicon or an oxide, the fourth hard mask layer 70 may be formed of a nitride. When the first sacrificial patterns 60a are formed of polysilicon or a nitride, the fourth hard mask layer 70 may be formed of an oxide. When the first sacrificial patterns 60a are formed of an oxide or a nitride, the fourth hard mask layer 70 may be formed of polysilicon. The fourth hard mask layer 70 may be formed by, e.g., an atomic layer deposition (ALD) method.

Figure 1E:
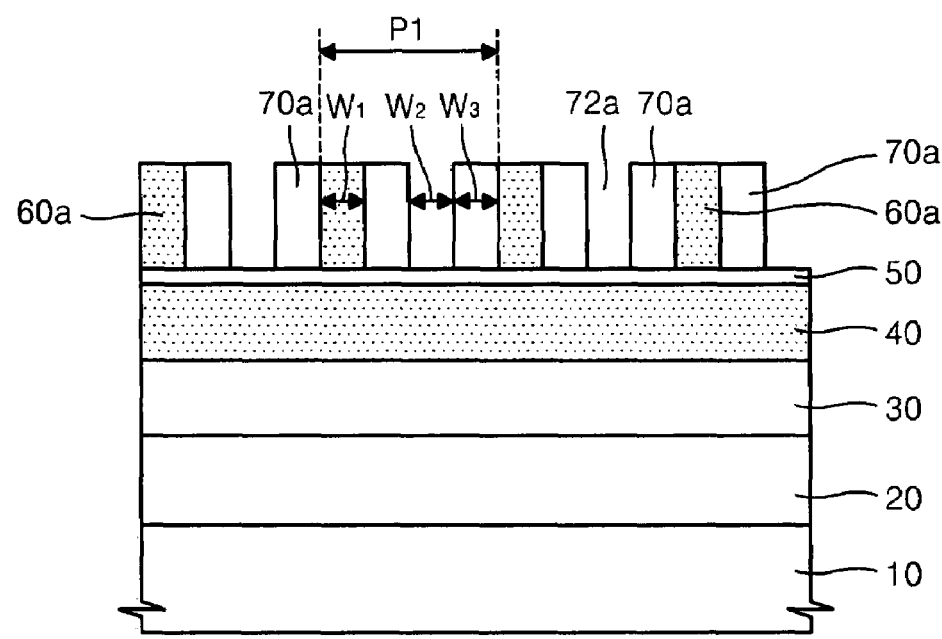

Referring to FIG. 1E, fourth hard mask patterns 70a may be formed between the first sacrificial patterns 60a by removing an upper portion of the fourth hard mask layer 70. More specifically, the upper portion of the fourth hard mask layer 70 may be removed by, e.g., an etchback or chemical mechanical polishing (CMP) process, to expose upper surfaces of the first sacrificial patterns 60a. During removal of the upper portion of the fourth hard mask layer 70, portions of the fourth hard mask layer 70 between the first sacrificial patterns 60a may be removed to expose portions of upper surfaces of the etching prevention layer 50, as further illustrated in FIG. 1E. In other words, the recess regions 72 may be extended in a vertical downward direction to contact the etching prevention layer 50 and form gaps 72a. Accordingly, each first sacrificial pattern 60a may be positioned between two fourth hard mask patterns 70a and in direct contact therewith to form a grouping of three patterns, so each gap 72a may be between two adjacent groupings of such three patterns, as further illustrated in FIG. 1E.

When the first thickness d1 of the fourth hard mask layer 70 is about ¼ of the first pitch P1, a third width W3 of the fourth hard mask pattern 70a may be substantially equal thereto, so the first and third widths W1 and W3 may be substantially equal to one another. In this respect, it is noted that since the first, second, and third widths W1, W2, and W3 are formed to be substantially similar to each other, each of the first width W1, second width W2, and third width W3 may substantially equal about ¼ of the first pitch P1. In other words, as illustrated in FIG. 1E, if the first pitch P1 substantially equals a sum of the first and second widths W1 and W2 and two third widths W3, and each of the first, second, and third widths W1, W2, and W3 equals about ¼ of the first pitch P1, a pitch between the fourth hard mask patterns 70a may equal about ½ of the first pitch P1.

Figure 1F:
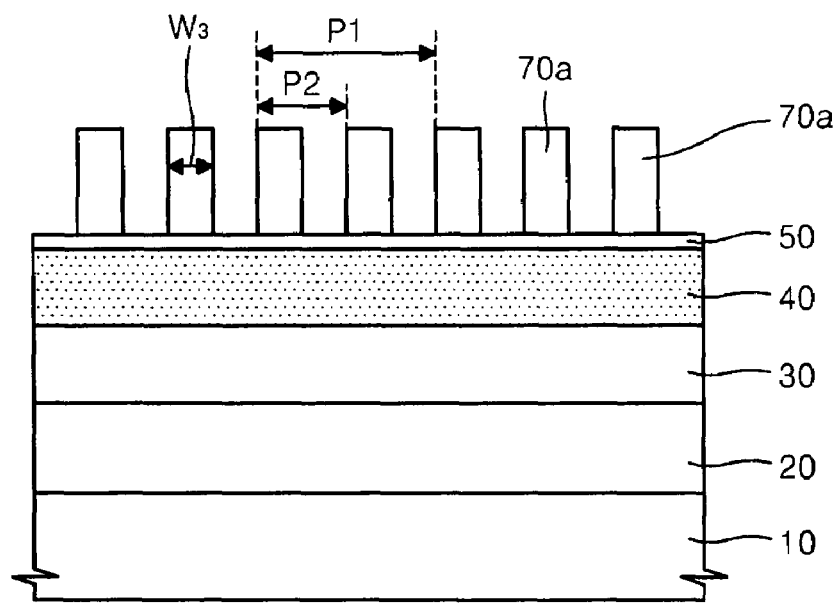

Referring to FIG. 1F, the first sacrificial patterns 60a may be removed using the fourth hard mask patterns 70a and the etching prevention layer 50 as an etch mask. As a result, only the fourth hard mask patterns 70a may remain on the etching prevention layer 50. The fourth hard mask patterns 70a may have a second pitch P2 therebetween. The second pitch P2 may equal about ½ of the first pitch P1, as discussed previously with reference to FIG. 1E.

Figure 1G:
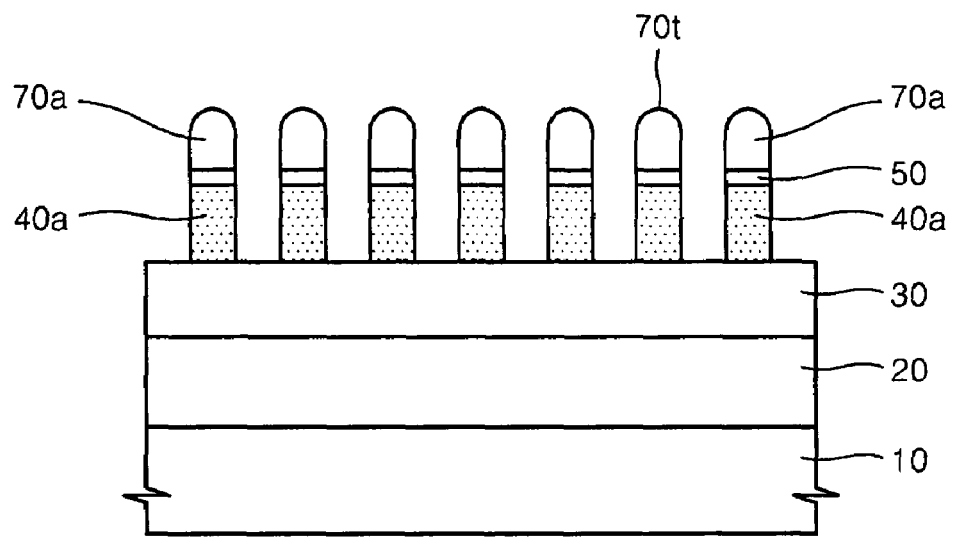

Referring to FIG. 1G, the third hard mask layer 40 and the etching prevention layer 50 may be etched by using the fourth mask patterns 70a as an etch mask to form third hard mask patterns 40a. In other words, portions of the third hard mask layer 40 and the etching prevention layer 50 positioned between adjacent fourth hard mask patterns 70a may be removed to expose portions of an upper surface of the second mask layer 30, as illustrated in FIG. 1G.

Further, upper portions of the fourth hard mask patterns 70a may be removed during formation of the third hard mask patterns 40a, so an overall thickness of each of the fourth hard mask patterns 70a, i.e., a vertical distance as measured in an upward direction from an upper surface of the etching prevention layer 50, may be reduced, and irregular upper surfaces 70t may be formed on the fourth hard mask patterns 70a. More specifically, during use of the fourth hard mask patterns 70a as an etch mask to form the third hard mask patterns 40a, ions may collide against upper surfaces of the fourth hard mask patterns 70a to form a plurality of facets thereon, thereby forming irregular upper surfaces 70t, as further illustrated in FIG. 1G. It is noted that "thickness" and "height" may be used hereinafter interchangeably.

For example, when the third and fourth hard mask layers 40 and 70 are formed of polysilicon and oxide, respectively, a gaseous mixture, e.g., hydrogen bromide (HBr), chloride ($Cl_2$), and oxygen ($O_2$), may be used as an etching gas to etch the third hard mask layer 40. Accordingly, ions of the gaseous mixture may collide with the third hard mask layer 40 to remove portions thereof, and may collide with the fourth hard mask patterns 70a to form the plurality of facets on the upper surfaces thereof, i.e., form irregular upper surfaces 70t.

Figure 1H:
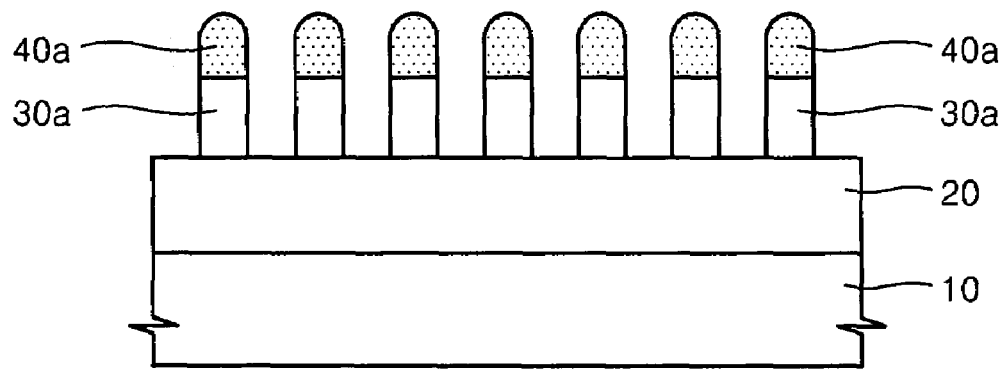

Next, the second hard mask layer 30 may be etched using the third and fourth hard mask patterns 40a and 70a as an etch mask to form second hard mask patterns 30a. More specifically, as further illustrated in FIG. 1G, the fourth hard mask patterns 70a may be positioned on corresponding third hard mask patterns 40a with the etching prevention layer 50 therebetween, so during etching of the second hard mask layer 30, double-layered mask patterns, i.e., the fourth hard mask patterns 70a on the third hard mask patterns 40a, may be used. When the second hard mask patterns 30a are formed, as illustrated in FIG. 1H, the fourth hard mask patterns 70a and the etching prevention layer 50 may be consumed and/or removed. The third hard mask patterns 40a may remain on corresponding second hard mask patterns 30a to form a double-layered etch mask for etching the first hard mask layer 20.

Figure 1I:
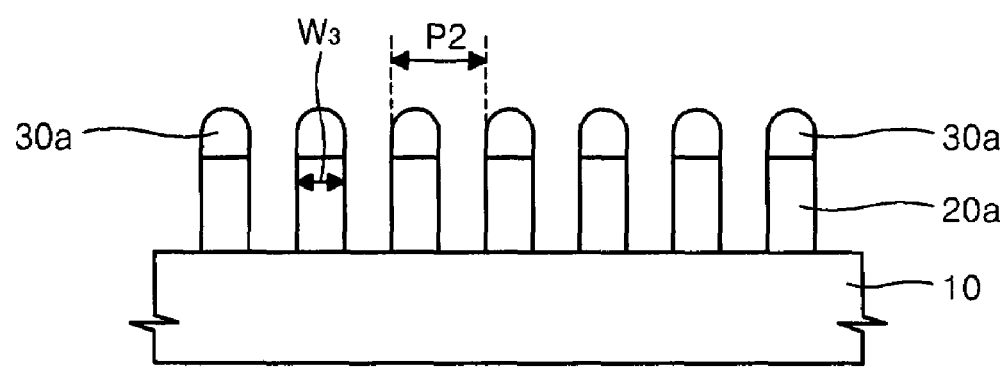

More specifically, the first hard mask layer 20 may be etched using the third and second hard mask patterns 40a and 30a as an etch mask to form first hard mask patterns 20a. It is noted, however, that as a result of etching, upper surfaces of the third hard mask patterns 40a may be irregularly shaped, as discussed previously with respect to the fourth hard mask patterns 70a in FIG. 1G. When the first hard mask patterns 20a are formed, the third hard mask patterns 40a and the second hard mask patterns 30a may be consumed and/or removed, so a plurality of the first hard mask patterns 20a may remain on the substrate 10. Each of the first hard mask patterns 20a may have the third width W3, and may be spaced apart from an adjacent first hard mask pattern 20a at the second pitch P2, as illustrated in FIG. 1I. As further illustrated in FIG. 1I, the first hard mask patterns 20a may have substantially uniform heights, and may have substantially flat upper surfaces in parallel to the substrate 10.

In a method for forming hard mask patterns according to embodiments of the present invention, double-layered mask patterns may be used for patterning each of the first and second hard mask layers 20 and 30 in order to provide the first hard mask patterns 20a with an improved structure. More specifically, use of double-layered etch masks may be advantageous in using upper layers thereof, e.g., third hard mask patterns 40a when third and second hard mask patterns 30a and 40a are used, to substantially absorb ion collisions during etching, thereby minimizing etching damage to lower layers thereof, e.g., formation of a plurality of facets, decreased height due to consumption, and so forth. In other words, if double-layered hard mask patterns are not used, i.e., conventional single-layered hard mask patterns are used, upper surfaces of the single-layered hard mask patterns may be damaged during etching, e.g., a plurality of facets may be formed thereon, thereby imparting surface defects to a subsequently etched underlying layer. Such surface defects may deteriorate pattern structure and may cause pattern height reduction, thereby triggering a pattern collapse and/or limiting resolution of final hard mask patterns. Accordingly, use of three hard mask layers in order to facilitate use of double-layered hard mask patterns at a time, e.g., use of the second and third hard mask patterns 40a and 30a to pattern the second hard mask layer 20, may be advantageous to form hard mask patterns with a predetermined height and reduced pitch therebetween.

According to another exemplary embodiment illustrated in FIGS. 2A-2I, the first hard mask patterns 20a may be formed according to a method that is substantially the same as the method described previously with reference to FIGS. 1A-1I, with the exception of forming second sacrificial patterns 180a on the fourth hard mask patterns 70a.

Figure 2A:
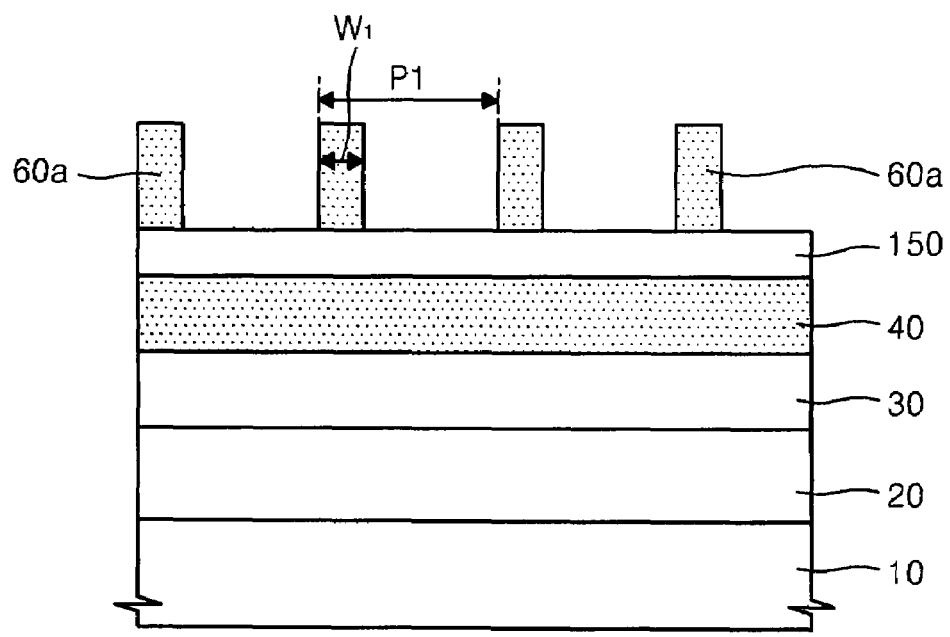
FIGS. 2A-2I illustrate cross sectional views of a semiconductor device during sequential stages of a method for forming hard mask patterns thereon according to another embodiment of the present invention.

Referring to FIG. 2A, the first hard mask layer 20, the second hard mask layer 30, and the third hard mask layer 40 may be sequentially formed on the substrate 10 as described previously with reference to FIGS. 1A-1C. An etching prevention layer 150 may be formed on the third hard mask layer 40, followed by formation of the first sacrificial patterns 60a thereon via, e.g., a photoresist mask pattern (not shown), i.e., a plurality of patterns having a first pitch P1 therebetween. The etching prevention layer 150 may be substantially similar to the etching prevention layer 50 described previously with reference to FIG. 1B, with the exception of having a larger thickness, e.g., a thickness substantially equal to the first width W1 of the first sacrificial patterns 60a.

Figure 2B:
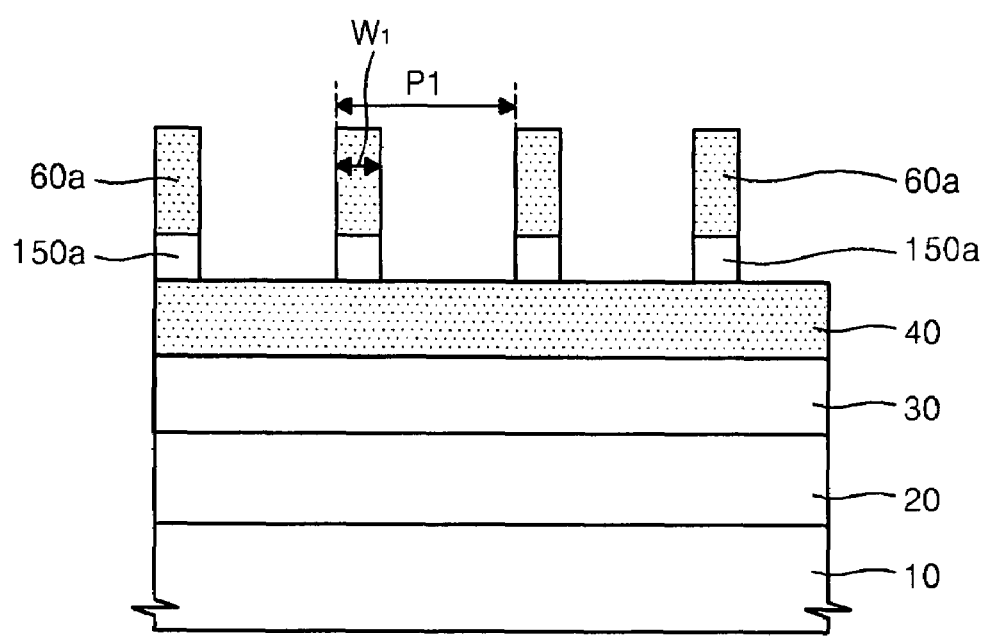

Referring to FIG. 2B, the etching prevention layer 150 may be patterned using the first sacrificial patterns 60a to form an etching prevention patterns 150a, thereby exposing portions of upper surfaces of the third hard mask layer 40. The photoresist mask pattern may be used in addition to the first sacrificial patterns 60a to form the etching prevention patterns 150a.

Figure 2C:
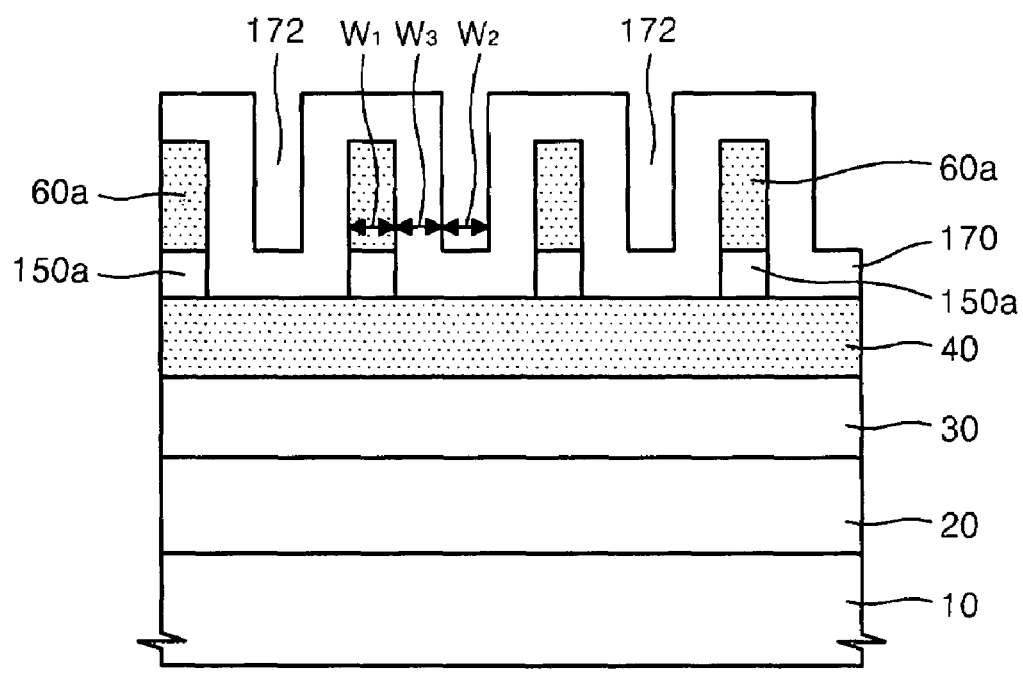

Referring to FIG. 2C, a fourth hard mask layer 170 may be formed on the third hard mask layer 40 and first sacrificial patterns 60a to cover outer surfaces thereof in a substantially same method described previously with respect to the fourth hard mask 70 layer in FIG. 1D. Accordingly, the fourth hard mask layer 170 may have the substantially uniform first thickness d1, so recess regions 172 having the second width W2 may be defined between outer surfaces of two adjacent vertical portions of the first sacrificial patterns 60a. The first thickness d1 of the fourth hard mask layer 170 may substantially equal the first width W1, i.e., may equal about ¼ of the first pitch P1.

Figure 2D:
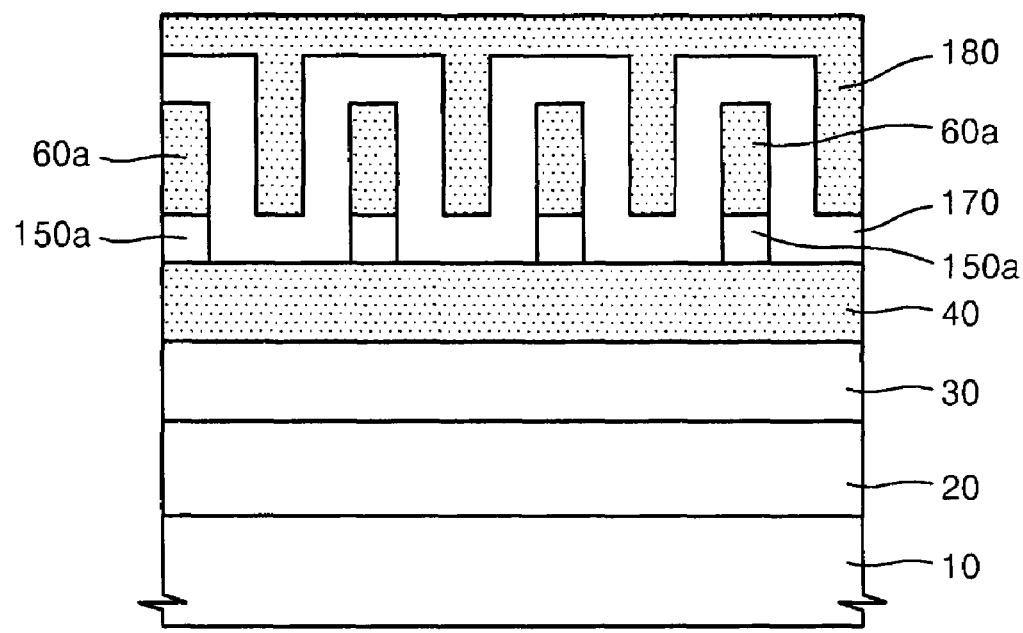

Referring to FIG. 2D, a second sacrificial film 180 may be formed on the fourth hard mask layer 170 to coat upper surfaces thereof and to fill the recess regions 172. The second sacrificial film 180 may be formed of a substantially same material as the first sacrificial patterns 60a, as described previously with respect to FIG. 1B.

Figure 2E:
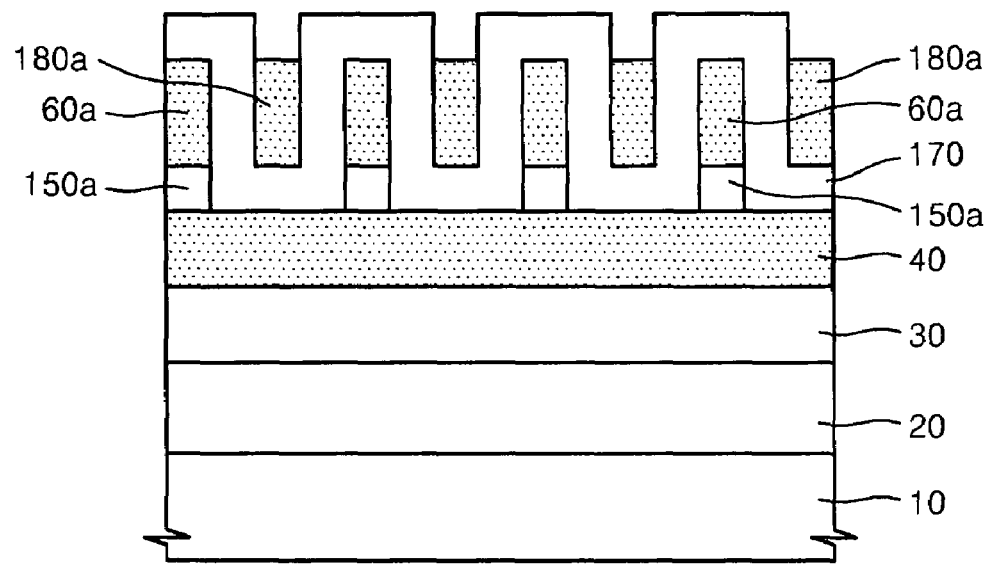

Referring to FIG. 2E, upper portions of the second sacrificial film 180 may be removed, e.g., by a wet etching method, to expose upper horizontal portions of the fourth hard mask layer 170 to form second sacrificial patterns 180a in the recess regions 172. More specifically, upper portions of the second sacrificial film 180 may be removed so upper surfaces of the second sacrificial patterns 180a in the recess regions 172 and of the first sacrificial patterns 60a may be substantially aligned, i.e., extend to a substantially same height. Accordingly, upper horizontal portions of the fourth hard mask layer 170 may protrude above upper surfaces of the first and second sacrificial patterns 60a and 180a. The second sacrificial patterns 180a may have the first pitch P1 therebetween.

Figure 2F:
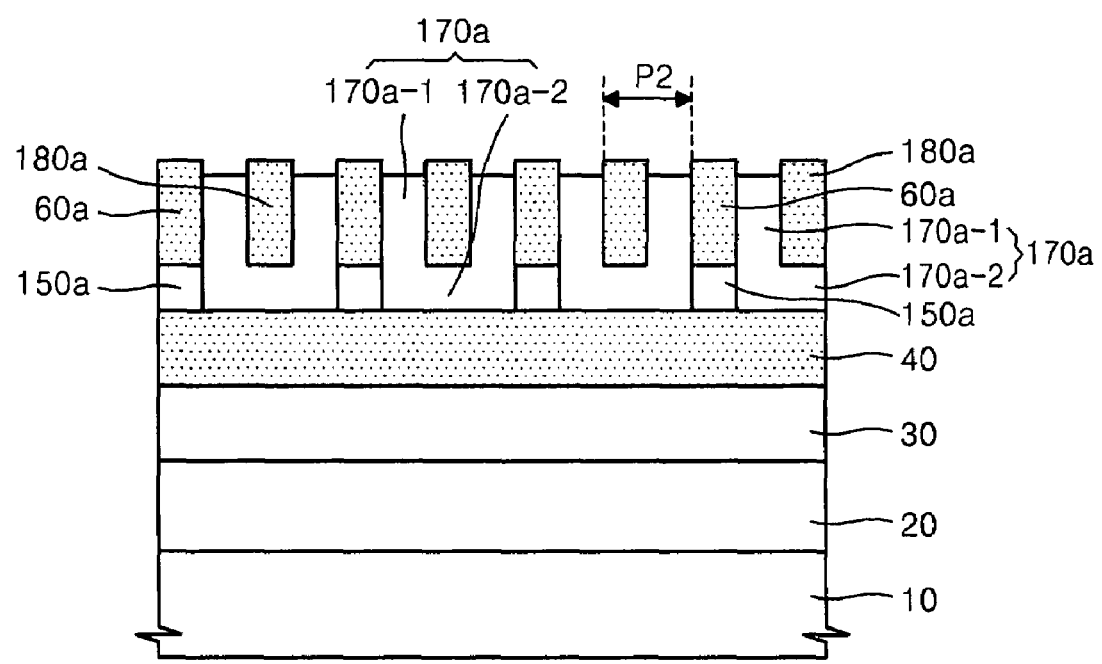

Referring to FIG. 2F, the horizontal portions of the fourth hard mask layer 170, i.e., portions of the fourth hard mask layer 170 coating the upper surfaces of the first sacrificial patterns 60a, may be removed by, e.g., wet etching, dry etching, or a combination thereof, to expose the upper surfaces of the first sacrificial patterns 60a and to form fourth hard mask patterns 170a. The fourth hard mask patterns 170a may include vertical portions 170a-1 and bottom portion 170a-2, so two vertical portions 170a-1 and one bottom portion 170a-2 therebetween may form a U-shape. As such, the fourth hard mask patterns 170a may include a plurality of "U-shapes" positioned along the third hard mask layer 40, so each first sacrificial pattern 60a may be positioned on a corresponding etching prevention layer 150a between two "U-shapes." Each second sacrificial pattern 180a may be positioned on a corresponding bottom portion 170a-2 of the fourth hard mask patterns 170a, i.e., inside the "U-shape," so each vertical portion 170a-1 may be between a first sacrificial pattern 60a and a second sacrificial pattern 180a. Accordingly, the first and second sacrificial patterns 60a and 180a may form an alternating line pattern in a same direction and to a substantially same height on the substrate 10. The first and second sacrificial patterns 60a and 180a may have the second pitch P2 therebetween. The fourth hard mask patterns 170a may have a second pitch P2 therebetween.

If the wet etching method is used to form the fourth hard mask patterns 170a, e.g., the fourth hard mask layer 170 is formed of an oxide and the first and second sacrificial patterns 60a and 180a are formed of polysilicon, then an etchant, e.g., an aqueous fluorine (F), may be used to etch the fourth hard mask layer 170 at a relatively high etching selectivity with respect to the first and second sacrificial patterns 60a and 180a. Examples of fluorine precursors may include diluted hydrogen fluoride (DHF), e.g., pure water and HF mixed at a volumetric ratio of about 50:1, ammonium fluoride ($NH_4F$), and/or combinations thereof.

If the dry etching method is used to form the fourth hard mask patterns 170a, e.g., the fourth hard mask layer 170 is formed of an oxide and the first and second sacrificial patterns 60a and 180a are formed of polysilicon, then an etching gas, e.g., fluorine, may be used. Examples of fluorine gas precursors may include fluorocarbon (CxFy) gas, where x and y may be integers between 1 and 10, a gas mixture of CxFy and $O_2$, a gas mixture of CxFy, $O_2$, and Ar, and so forth. Examples of fluorocarbon gas may include hexafluoropropene ($C_3F_6$), hexafluorobutadiene ($C_4F_6$), octafluorocyclobutane ($C_4F_8$), or octafluorocyclopentene ($C_5F_8$). The etching gas may be used in a plasma form generated in an etching chamber. Alternatively, the etching gas may be used without ion energy under high pressure, i.e., in an atmosphere higher than the etching gas.

Figure 2G:
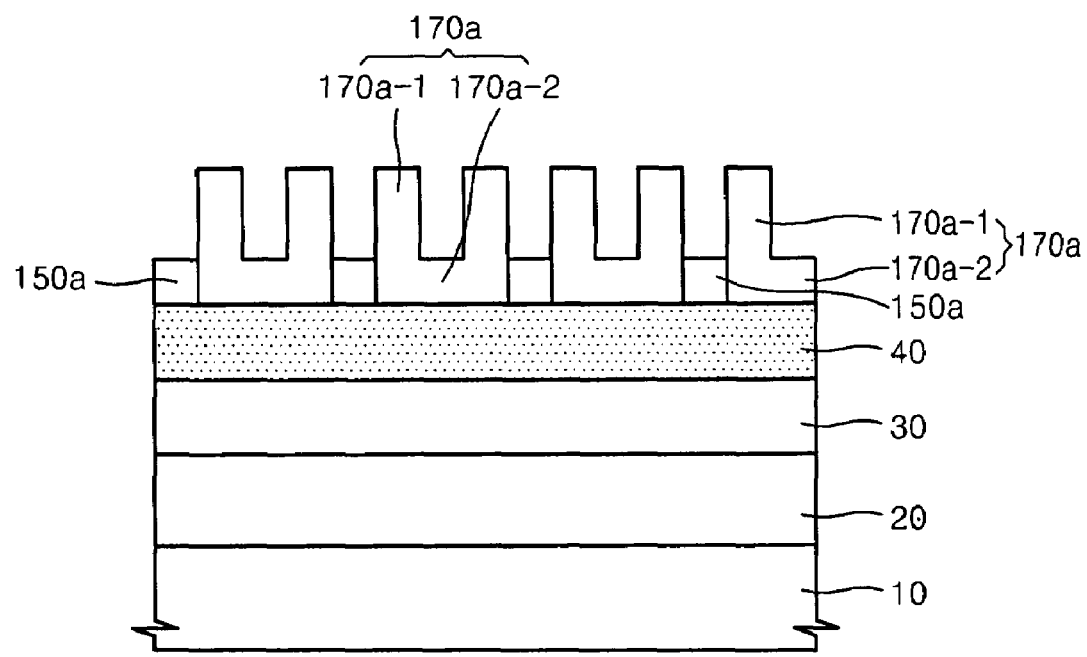

Referring to FIG. 2G, the first and second sacrificial patterns 60a and 180a may be removed by, e.g., the wet and/or dry etching method, to expose upper surfaces of the etching prevention patterns 150a and of the bottom portions 170a-2 of the fourth hard mask patterns 170a.

For example, if the first and second sacrificial patterns 60a and 180a are formed of, e.g., polysilicon, an etchant in the wet etching may include, e.g., ammonium hydroxide ($NH_4OH$). For example, a mixture of $NH_4OH$, hydrogen peroxide ($H_2O_2$), and water ($H_2O$) at a volumetric ratio of about 4:1:95 may be used. If the dry etching is used to remove the first and second sacrificial patterns 60a and 180a, a chemical dry etch (CDE) process using an etching gas including, e.g., carbon tetra fluoride ($CF_4$), may be used. For example, the CDE process may include a gaseous mixture of $CF_4$ and $O_2$ or a gaseous mixture $CF_4$, $O_2$, $N_2$, and HF.

Figure 2H:
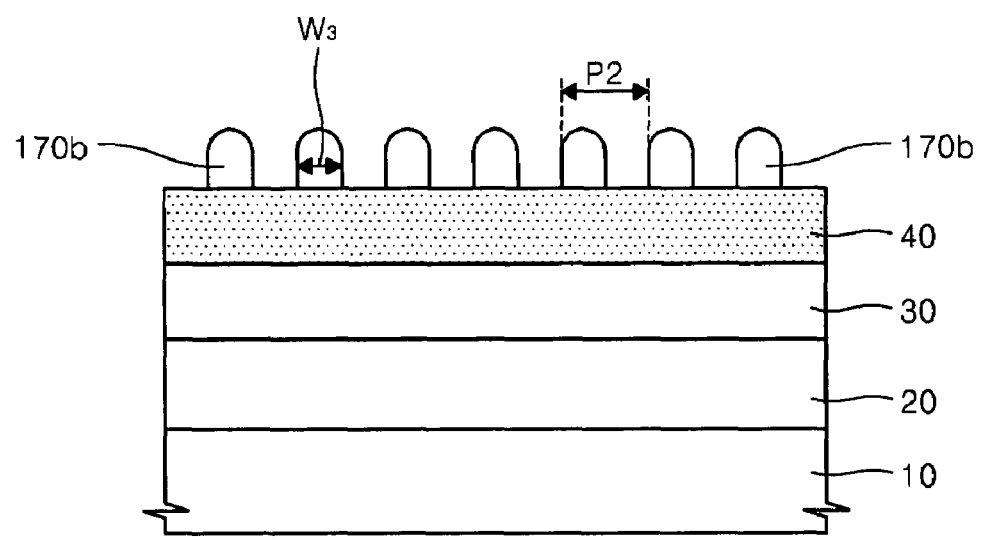

Referring to FIG. 2H, the etching prevention patterns 150a and the bottom portions 170a-2 of the fourth hard mask patterns 170a may be, e.g., etched back in an anisotropic dry etching method, to expose upper surfaces of the third hard mask layer 40 between the vertical portions 170a-1.

During etching of the prevention patterns 150a and the bottom portions 170a-2 of the fourth hard mask patterns 170a, upper portions of the vertical portions 170a-1 of the fourth hard mask patterns 170a having a predetermined thickness may be removed and/or consumed to form reduced height fourth hard mask patterns 170b on the third hard mask layer 40, as further illustrated in FIG. 2H. Each of the reduced height fourth hard mask patterns 170b may have the third width W3, and may be positioned at a second pitch P2 with respect to an adjacent reduced height fourth hard mask pattern 170b.

Figure 2I:
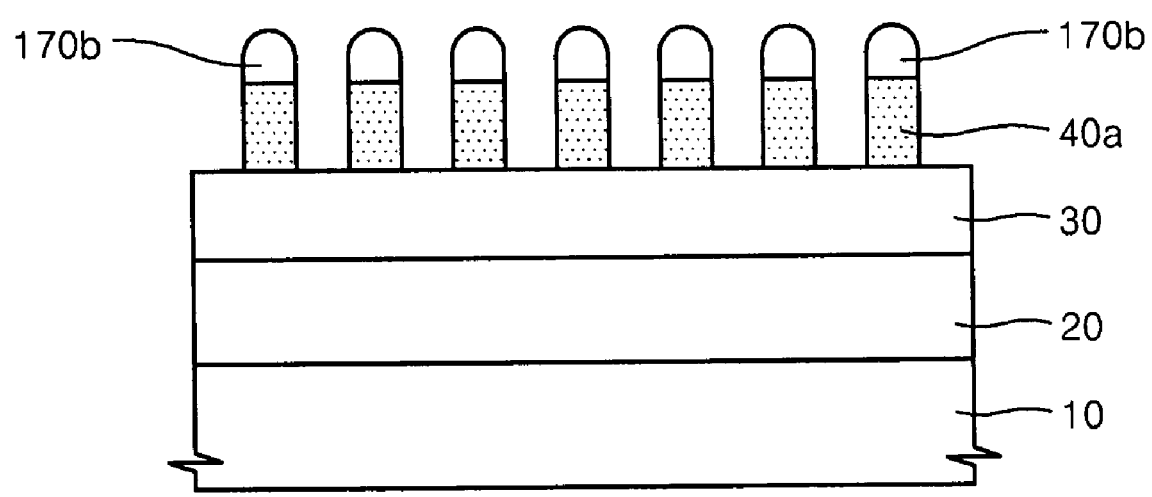

Referring to FIG. 2I, the third hard mask layer 40 may be etched using the reduced height fourth hard mask patterns 170b as an etch mask to form the third hard mask patterns 40a. The height of the reduced height fourth hard mask patterns 170b may decrease further during the etching process of the third hard mask layer 40. Then, the reduced height fourth hard mask patterns 170b and the third hard mask patterns 40a may be used as a double-layer mask to pattern the second hard mask layer 30 in order to form the second hard mask patterns 30a, as described previously with reference to FIGS. 1G-1H. Similarly, the second and third hard mask patterns 30a and 40a may be used as a double-layer mask to pattern the first hard mask layer 20 in order to form the first hard mask patterns 20a, as described previously with reference to FIGS. 1H-1I.

According to another exemplary embodiment illustrated in FIGS. 3A-3F, the hard mask patterns described previously with reference to FIGS. 1A-1I may be used to form a device isolation area on a semiconductor substrate. However, it should be noted that formation of a device isolation area on a semiconductor substrate by other method, e.g., by using the hard mask patterns described previously with reference to FIGS. 2A-2F, are within the scope of the present invention.

Figure 3A:
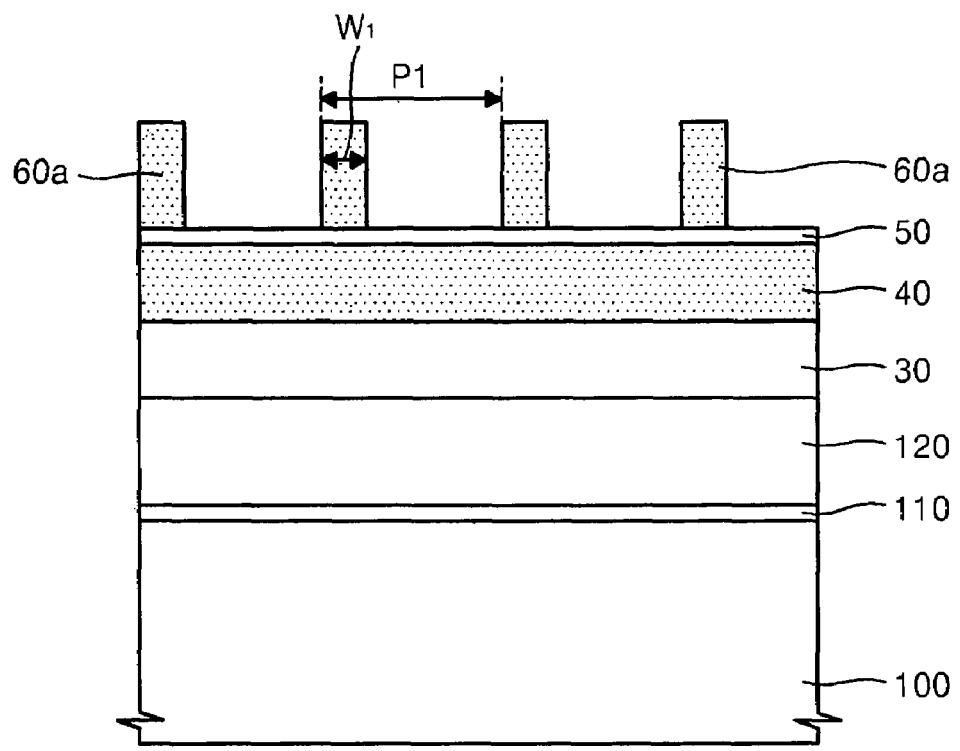
FIGS. 3A-3E illustrate cross sectional views of a semiconductor device during sequential stages in a method for forming fine patterns of a semiconductor device according to an embodiment of the present invention.

Referring to FIG. 3A, a pad oxide film 110 may be formed on a semiconductor substrate 100. A first hard mask layer 120 formed of, e.g., a nitride, may be formed on the pad oxide film 110. Then, the second hard mask layer 30, the third hard mask layer 40, and the etching prevention layer 50 may be formed sequentially on the first hard mask layer 120 according to the method described previously with reference to FIGS. 1A-1C. The first sacrificial patterns 60a may be formed on the etching prevention layer 50 with the first pitch P1 therebetween.

Figure 3B:
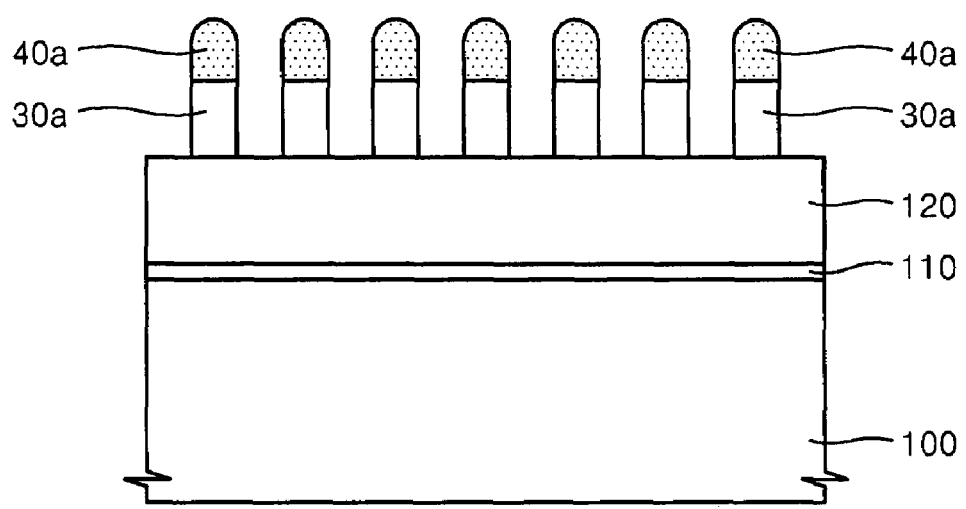

Referring to FIG. 3B, the second and third hard mask patterns 30a and 40a may be formed on the first hard mask layer 120 according to the method described previously with reference to FIGS. 1D-1H.

Figure 3C:
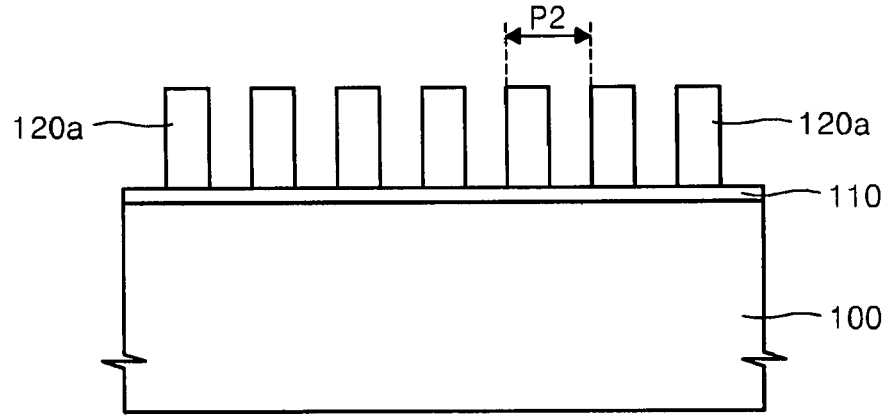

Referring to FIG. 3C, the first hard mask layer 120 may be patterned, e.g., via anisotropic dry etching, using the second and third hard mask patterns 30a and 40a as a double-layer etch mask to form first hard mask patterns 120a having the second pitch P2 therebetween. During formation of the first hard mask patterns 120a, the second hard mask patterns 30a may be consumed and/or removed, so upper surfaces of the first hard mask patterns 120a may be exposed.

Figure 3D:
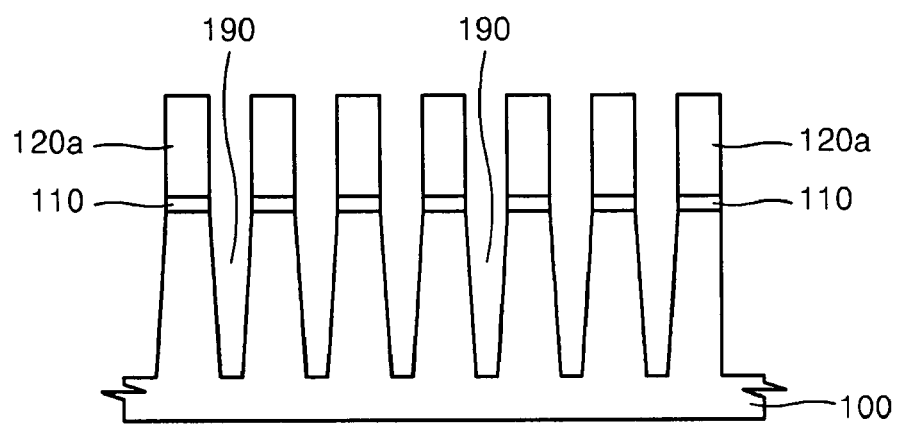

Referring to FIG. 3D, portions of the substrate 100 and the pad oxide film 110 between the first hard mask patterns 120a may be removed by, e.g., anisotropic dry etching, to form trenches 190. More specifically, the first hard mask patterns 120a may be used as an etch mask to form trenches 190, so every trench 190 may be between two adjacent first hard mask patterns 120a. A width of each trench 190 may be non-uniform, so a width thereof may decrease as a distance from a bottom surface of the semiconductor substrate 100 decreases.

Figure 3E:
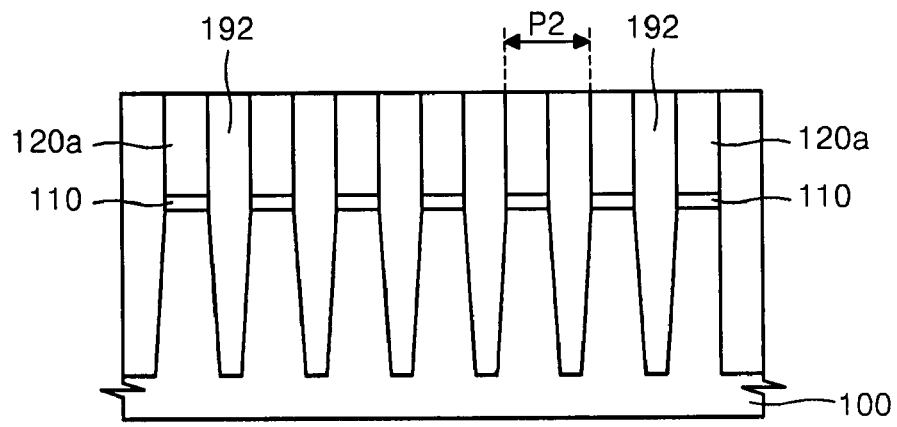

Referring to FIG. 3E, an insulation material (not shown) may be deposited to fill the trenches 190 and to cover upper surfaces of the first hard mask patterns 120a. Next, an upper portion of the insulation material may be removed by, e.g., planarization via CMP, to expose upper surfaces of the first hard mask patterns 120a. The isolation material in the trenches 190 may form isolation areas 192 therein. The isolation areas 192 may have the second pitch P2 therebetween, thereby exhibiting a reduced pitch as compared to a pitch achieved via a conventional photolithography process, i.e., exceeding a resolution limit in the conventional photolithography process.

The first hard mask patterns 120a may be formed by using a total of four hard mask layers, so that two hard mask patterns may be used at a time to pattern an underlying layer. Thus, the semiconductor substrate 100 may be etched to a desired depth using the first hard mask patterns 120a for the formation of the trenches 190.

Methods for forming hard mask patterns according to embodiments of the present invention may be advantageous in providing fine patterns with a reduced pitch therebetween, thereby overcoming a resolution limit in the photolithography process. Further, the hard mask patterns may be formed by using double layered-masks, thereby forming patterns with enhanced depths and superior uniformity.

First, second, third, and fourth hard mask layers may be sequentially deposited on a substrate, with the second hard mask layer having an etching selectivity different from that of the first and third hard mask layers. Fourth hard mask patterns may be formed by a double patterning process in the fourth hard mask layer, and may be used as an etch mask to pattern the third hard mask layer into third hard mask patterns. The fourth and third hard mask patterns may be used as an etch mask to pattern the second hard mask layer into second hard mask patterns, sequentially followed by use of the second and third hard mask patterns as an etch mask to pattern the first hard mask layer into first hard mask patterns having a fine pitch therebetween and a sufficiently desired height.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming hard mask patterns, comprising:
sequentially forming a first hard mask layer, a second hard mask layer, and a third hard mask layer on a substrate, each hard mask layer being formed of a material having a different etching selectivity with respect to an adjacent hard mask layer;
forming first sacrificial patterns having a first pitch therebetween on the third hard mask layer, wherein forming the first sacrificial patterns includes:
forming an etching prevention layer on the third hard mask layer,
forming a first sacrificial film on the etching prevention layer, and
patterning the first sacrificial film by a photolithography process, such that portions of the first sacrificial film are removed to form etching prevention patterns;
forming fourth hard mask patterns between the first sacrificial patterns, such that the fourth hard mask patterns have a second pitch therebetween, the second pitch being substantially equal to about ½ of the first pitch, wherein forming the fourth hard mask patterns includes forming a fourth hard mask layer having a uniform thickness on lateral and upper surfaces of each of the first sacrificial patterns, the thickness of the fourth hard mask layer being adjusted to form recess regions between the first sacrificial patterns;
forming a second sacrificial film in the recess regions;
removing upper portions of the second sacrificial film and of the fourth hard mask layer to form second sacrificial patterns and the fourth hard mask patterns, respectively;
removing the first and second sacrificial patterns to expose upper surfaces of the etching prevention patterns and of bottom portions of the fourth hard mask patterns;
etching back the etching prevention patterns and bottom portions of the fourth hard mask patterns to form reduced height fourth hard mask patterns on the third hard mask layer;
patterning the third hard mask layer to form third hard mask patterns with the second pitch therebetween using the fourth hard mask patterns as an etch mask;
patterning the second hard mask layer to form second hard mask patterns with the second pitch therebetween using the third and fourth hard mask patterns as an etch mask; and
patterning the first hard mask layer to form first hard mask patterns with the second pitch therebetween using the second and third hard mask patterns as an etch mask.

2. The method as claimed in claim 1, wherein the first sacrificial patterns are formed of a substantially same material as the third hard mask layer.

3. The method as claimed in claim 1, wherein the first, second, and third hard mask layers are formed of first, second, and third materials, respectively, each one of the first, second, and third materials being an oxide, a nitride, or a polysilicon, such that each of the first, second, and third materials are different from one another.

4. The method as claimed in claim 1, wherein the first and second sacrificial patterns are formed of a substantially same material as the third hard mask layer.

5. The method as claimed in claim 1, wherein each of the first and second sacrificial patterns are formed of polysilicon.

6. The method as claimed in claim 1, wherein removing the first and second sacrificial patterns includes removal via wet etching, dry etching, and/or a combination thereof.

7. The method as claimed in claim 1, wherein forming the fourth hard mask patterns includes removing a portion of the fourth hard mask layer to expose upper surfaces of the first sacrificial patterns, such that each first sacrificial pattern is between and in direct contact with two fourth hard mask patterns.

8. The method as claimed in claim 7, further comprising removing the first sacrificial patterns using the fourth hard mask patterns.

9. A method for forming fine patterns of a semiconductor device, comprising:
sequentially forming a first hard mask layer, a second hard mask layer, and a third hard mask layer on a substrate, each hard mask layer being formed of a material having a different etching selectivity with respect to an adjacent hard mask layer;
forming first sacrificial patterns having a first pitch therebetween on the third hard mask layer;
forming an etching prevention layer between the third hard mask layer and the first sacrificial patterns;
patterning the etching prevention layer to form etching prevention patterns;
forming fourth hard mask patterns between the first sacrificial patterns, such that the fourth hard mask patterns have a second pitch therebetween, the second pitch being substantially equal to about ½ of the first pitch, wherein forming the fourth hard mask patterns includes:
forming a fourth hard mask layer having a uniform thickness on lateral and upper surfaces of each of the first sacrificial patterns, the thickness of the fourth hard mask layer being adjusted to form recess regions between the first sacrificial patterns,
forming a second sacrificial film in the recess regions, and
removing upper portions of the second sacrificial film and of the fourth hard mask layer to form second sacrificial patterns and fourth hard mask patterns, respectively;
removing the first and second sacrificial patterns to expose upper surfaces of the etching prevention patterns and of bottom portions of the fourth hard mask patterns;
etching back the etching prevention patterns and bottom portions of the fourth hard mask patterns to form reduced height fourth hard mask patterns on the third hard mask layer;
patterning the third hard mask layer to form third hard mask patterns with the second pitch therebetween using the fourth hard mask patterns as an etch mask;
patterning the second hard mask layer to form second hard mask patterns with the second pitch therebetween using the third and fourth hard mask patterns as an etch mask;
patterning the first hard mask layer to form first hard mask patterns with the second pitch therebetween using the second and third hard mask patterns as an etch mask;
forming a plurality of trenches with the second pitch therebetween in the substrate using the first hard mask patterns as an etch mask; and
filling the trenches with an insulation film to form isolation areas in the substrate.

10. The method as claimed in claim 9, further comprising forming a pad oxide film between the substrate and the first hard mask layer, the first hard mask layer being formed of a nitride.

11. The method as claimed in claim 9, wherein each of the second hard mask layer and the third hard mask layer is formed of an oxide or a polysilicon, the second and third hard mask layers being formed of different materials.

12. The method as claimed in claim 9, wherein forming the fourth hard mask patterns includes removing a portion of the fourth hard mask layer to expose upper surfaces of the first sacrificial patterns, and removing the first sacrificial patterns.

* * * * *